United States Patent [19]
Tomita

[11] Patent Number: 5,708,304
[45] Date of Patent: Jan. 13, 1998

[54] SEMICONDUCTOR DEVICE

[75] Inventor: Yoshihiro Tomita, Tokyo, Japan

[73] Assignee: Mitsubishi Denki Kabushiki Kaisha, Tokyo, Japan

[21] Appl. No.: 708,615

[22] Filed: Sep. 5, 1996

[30]  Foreign Application Priority Data

Mar. 27, 1996  [JP]  Japan ................. 8-072043

[51] Int. Cl.$^6$ .................. H01L 23/48; H01L 23/52; H01L 29/40
[52] U.S. Cl. .............. 257/778; 257/737; 257/738; 257/780; 257/692; 257/784
[58] Field of Search .................. 257/737, 692, 257/778, 780, 784, 738

[56]  References Cited

U.S. PATENT DOCUMENTS

| | | | |
|---|---|---|---|
| 4,641,176 | 2/1987 | Keryhuel et al. | 257/693 |
| 4,691,225 | 9/1987 | Murakami et al. | 257/693 |
| 5,399,903 | 3/1995 | Rostoker et al. | 257/666 |
| 5,440,169 | 8/1995 | Tomita et al. | 257/667 |
| 5,461,197 | 10/1995 | Hiruta et al. | 257/787 |
| 5,535,101 | 7/1996 | Miles et al. | 257/787 |
| 5,557,150 | 9/1996 | Variot et al. | 257/787 |
| 5,565,709 | 10/1996 | Fukushima et al. | 257/787 |

FOREIGN PATENT DOCUMENTS

| | | | |
|---|---|---|---|
| 582052 | 2/1994 | European Pat. Off. | 257/737 |
| 9220097 | 11/1992 | WIPO | 257/693 |

*Primary Examiner*—Mahshid D. Saadat
*Assistant Examiner*—T. M. Arroyo
*Attorney, Agent, or Firm*—Leydig, Voit & Mayer, Ltd.

[57]  ABSTRACT

A semiconductor device is reduced in size and has a highly warp resistant structure. A sealing resin formed by transfer molding covers a whole semiconductor chip including pad electrodes, connecting bumps, an upper surface of a wiring board including a plurality of chip connecting patterns, a side surface of the wiring board, and a peripheral area of a lower surface of the wiring board surrounding an area where external electrode portions are located. The wiring board is substantially coextensive in an area with the semiconductor chip in plan configuration. The area occupied by the external electrode portions is smaller than the area occupied by the chip connecting patterns.

12 Claims, 3 Drawing Sheets

SEMICONDUCTOR DEVICE

BACKGROUND OF THE INVENTION

1. Field of the Invention

The present invention relates to a semiconductor device having a semiconductor chip mounted therein.

2. Description of the Background Art

FIG. 6 illustrates a conventional BGA (ball grid array) type semiconductor device. As shown, a plurality of pad electrodes 2 are formed on the lower surface of a semiconductor chip 1. A plurality of connecting bumps 5 are directly connected to corresponding of pad electrodes 2, respectively.

A plurality of chip connecting patterns 4 are formed on the upper surface of a wiring board 23, and a plurality of external electrode portions 30 are formed on the lower surface thereof. Each of the external electrode portions 30 includes a substrate connecting pattern 27 and a connecting terminal 28. The substrate connecting patterns 27 are formed directly on the lower surface of the wiring board 23, and the connecting terminals are formed on the substrate connecting patterns 27, respectively. The chip connecting patterns 4 are electrically connected to corresponding external electrode portions 30 (the substrate connecting patterns 27), and are directly connected to corresponding connecting bumps 5, respectively.

A sealing resin 26 is formed to cover the lower surface of the semiconductor chip 1 including the pad electrodes 2, the plurality of connecting bumps 5, and the upper surface of the wiring board 23 including the chip connecting patterns 4.

The wiring board 23 is larger in area than the semiconductor chip 1 in plan configuration. An area A1 wherein the external electrode portions 30 are formed is larger than an area A2 wherein the chip connecting patterns 4 are formed.

In the above described conventional semiconductor device, the area A1 wherein the external electrode portions 30 are formed is greater than the area A2 wherein the chip connecting patterns 4 are formed, and the external electrode portions 30 are formed in a part of an area corresponding to an area wherein the chip connecting patterns 4 are not formed. Thus, the wiring board 23 is larger in area than the semiconductor chip 1 in plan configuration.

As a result, the plan configuration of the wiring board 23 which is larger than that of the semiconductor chip 1 prevents the size reduction of the device and is prone to cause warpage in junction surfaces of the semiconductor chip 1 and wiring board 23, interfering with the mounting of the device on a mounting substrate.

SUMMARY OF THE INVENTION

According to the present invention, a semiconductor device comprises: a semiconductor chip having first and second major surfaces, the semiconductor chip including a plurality of pad electrodes formed on the first or second major surface thereof; a wiring board having first and second major surfaces, the semiconductor chip overlying the first major surface of the wiring board, the wiring board including a plurality of chip connecting patterns formed on the first major surface thereof, and a plurality of external electrode portions formed on the second major surface thereof, the plurality of chip connecting patterns being electrically connected to corresponding ones of the plurality of external electrode portions and electrically connected to corresponding ones of the plurality of pad electrodes, respectively; and a resin formed to cover the whole semiconductor chip including the plurality of pad electrodes, and the first major surface of the wiring board including the plurality of chip connecting patterns, wherein an area in which the plurality of external electrode portions are formed is smaller than an area in which the plurality of chip connecting patterns are formed.

Preferably, according to a first aspect of the present invention, the plurality of pad electrodes are formed on the second major surface of the semiconductor chip, and the semiconductor device further comprises a plurality of connecting electrodes directly connected to corresponding ones of the plurality of pad electrodes, respectively, the plurality of chip connecting patterns being directly connected to corresponding ones of the plurality of connecting electrodes, respectively, the resin being formed to cover the first major surface of the wiring board including the plurality of connecting electrodes.

Preferably, according to a second aspect of the present invention, the plurality of pad electrodes are formed on the first major surface of the semiconductor chip; and the plurality of chip connecting patterns surround the semiconductor chip and are connected to corresponding ones of the plurality of pad electrodes through metal lines, respectively.

Preferably, according to a third aspect of the present invention, the resin is formed by transfer mold process.

Preferably, according to a fourth aspect of the present invention, a distance between an end of the wiring board and the area in which the plurality of chip connecting patterns are formed is less than a distance between the end of the wiring board and the area in which the plurality of external electrode portions are formed; and the resin also covers a side surface of the wiring board and a part of the second major surface of the wiring board except where the plurality of external electrode portions are formed.

As above stated, in accordance with the semiconductor device of the first aspect of the present invention, the wiring board is substantially coextensive with the semiconductor chip in plan configuration, and the area wherein the plurality of external electrode portions are formed is smaller than the area wherein the plurality of chip connecting patterns are formed. This permits the size reduction of the device in corresponding relation to the size of the semiconductor chip.

The resin for the semiconductor device of the first aspect of the present invention is formed to cover the whole first major surface of the wiring board including the plurality of chip connecting patterns, effectively suppressing warpage in junction surfaces of the semiconductor chip and the wiring board through the plurality of pad electrodes, the plurality of connecting electrodes, and the plurality of chip connecting patterns.

Additionally, since the wiring board is substantially coextensive with the semiconductor chip in plan configuration, the warpage in the junction surfaces is not expanded at the ends of the wiring board.

Since the area wherein the plurality of external electrode portions are formed is smaller than the area wherein the plurality of chip connecting patterns are formed, the wiring board substantially coextensive with the semiconductor chip in plan configuration may be formed without hindrance.

In accordance with the semiconductor device of the second aspect of the present invention, the resin is formed to cover the whole first major surface of the wiring board including the plurality of chip connecting patterns, effectively suppresses the warpage in the junction surfaces of the semiconductor chip and the wiring board.

In accordance with the semiconductor device of the third aspect of the present invention, the transfer molded resin has the property of strongly suppressing the warpage in the junction surfaces.

In accordance with the first and third aspects of the present invention, if the plurality of chip connecting patterns (the pad electrodes and the connecting electrodes) are arranged in closely spaced relation, the transfer molded resin may accurately fill the junction between the semiconductor chip and the wiring board.

In accordance with the semiconductor device of the fourth aspect of the present invention, the resin is formed to cover also the side surface of the wiring board and the part of the second major surface of the wiring board except where the plurality of external electrode portions are formed. This provides a higher bonding strength between the resin and the wiring board, suppressing the warpage in the junction surfaces more effectively and improving the reliability of the device.

It is therefore an object of the present invention to provide a semiconductor device having a highly warpage-resistant structure as well as achieving the size reduction of the semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENTS

<First Preferred Embodiment>

Figure 1:
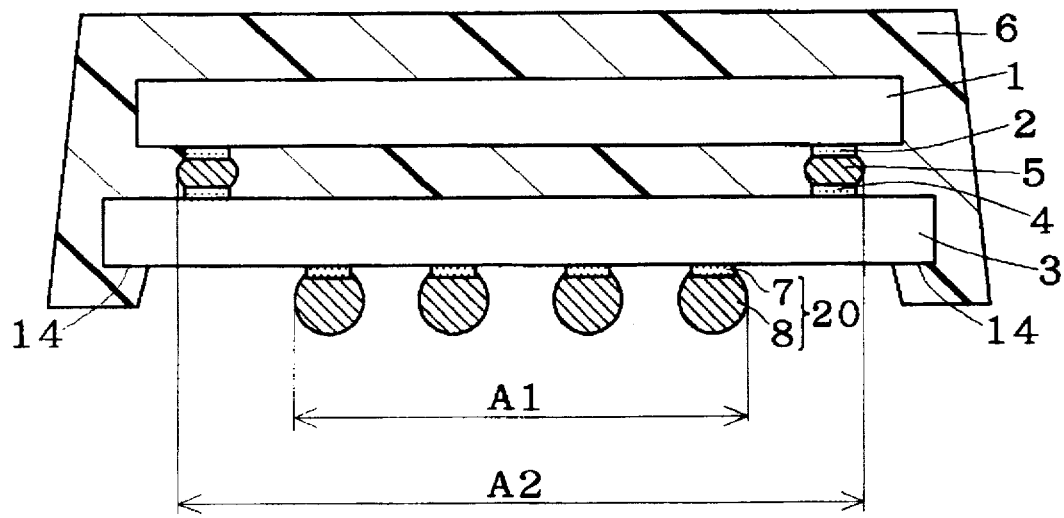
FIG. 1 is a cross-sectional view of a semiconductor device according to a first preferred embodiment of the present invention.

FIG. 1 is a cross-sectional view of a semiconductor device according to a first preferred embodiment of the present invention. As shown, a plurality of pad electrodes 2 are formed on the lower surface of a semiconductor chip 1. A plurality of connecting bumps 5 are directly connected to corresponding pad electrodes 2, respectively.

A plurality of chip connecting patterns 4 are formed on the upper surface of a wiring board 3, and a plurality of external electrode portions 20 are formed on the lower surface thereof. Each of the external electrode portions 20 includes a substrate connecting pattern 7 and a substantially spherical connecting terminal 8. The substrate connecting patterns 7 are directly formed on the lower surface of the wiring board 3, and the connecting terminals 8 are formed on the substrate connecting patterns 7, respectively. The chip connecting patterns 4 are electrically connected to corresponding external electrode portions 20 (the substrate connecting patterns 7), and are directly connected to corresponding connecting bumps 5, respectively. The wiring board 3 may include, but not limited to, a glass fiber reinforced epoxy resin substrate, a polyimide tape, and the like.

A sealing resin 6 is formed to cover the whole semiconductor chip 1 including the plurality of pad electrodes 2, the plurality of connecting bumps 5, the upper surface of the wiring board 3 including the plurality of chip connecting patterns 4, the side surface of the wiring board 3, and a peripheral area 14 of the lower surface of the wiring board 3 which surrounds an area A1 wherein the external electrode portions 20 are formed.

The sealing resin 6 is formed by the transfer mold process. A method of forming a resin on the lower surface of the wiring board 3 is disclosed in, for example, Japanese Patent Application Laid-Open No. 6-209054 (1994).

The wiring board 3 is substantially coextensive in plan configuration with the semiconductor chip 1. The area A1 wherein the plurality of external electrode portions 30 are formed is smaller than an area A2 wherein the plurality of chip connecting patterns 4 are formed.

The semiconductor device having such a construction according to the first preferred embodiment is placed on a mounting substrate (not shown,) and then heat is applied to melt and connect together the connecting terminals 8 of the external electrode portions 20 and corresponding of connecting terminals on the mounting substrate. This allows the semiconductor device to be mounted on the mounting substrate.

In the semiconductor device of the first preferred embodiment, the wiring board 3 is substantially coextensive in plan configuration with the semiconductor chip 1, and the area A1 wherein the plurality of external electrode portions 20 are formed is smaller than the area A2 wherein the plurality of chip connecting patterns 4 are formed. The area A1 is formed so that it falls within an area corresponding to the area A2. Thus, the size of the semiconductor device may be reduced in corresponding relation to the size of the semiconductor chip 1.

The reduction of the area A1 wherein the external electrode portions 20 (the substrate connecting patterns 7) are formed decreases the total wiring length of the substrate connecting patterns 7, accordingly reducing the inductance of the wiring. This achieves a semiconductor device having improved electrical characteristics.

Additionally, since the area A1 wherein the plurality of external electrode portions 20 are formed is smaller than the area A2 wherein the plurality of chip connecting patterns 4 are formed, the wiring board 3 substantially coextensive with the semiconductor chip 1 in plan configuration may be formed without hindrance.

The sealing resin 6 for the semiconductor device of the first preferred embodiment is formed to cover the whole upper surface of the wiring board 3 including the chip connecting patterns 4, effectively suppressing warpage in the junction surfaces of the semiconductor chip 1 and the wiring board 3 through the plurality of pad electrodes 2, the plurality of connecting bumps 5, and the plurality of chip connecting patterns 4.

The warpage in the junction surfaces is not expanded at the ends of the wiring board 3 since the wiring board 3 is substantially coextensive with the semiconductor chip 1 in plan configuration.

The sealing resin 6 for the semiconductor device of the first preferred embodiment is formed also on the side surface of the wiring board 3 and on the peripheral area 14 of the lower surface of the wiring board 3 which surrounds the area A1 wherein the external electrode portions 20 are formed. This provides a higher bonding strength between the sealing resin 6 and the wiring board 3 to suppress the warpage in the junction surfaces more effectively and to further improve the reliability of the device.

The sealing resin 6 for the semiconductor device of the first preferred embodiment is transfer molded to strongly suppress the warpage in the junction surfaces.

If the plurality of chip connecting patterns 4 (the pad electrodes 2, and the connecting bumps 5) are arranged in closely spaced relation, the formation of the sealing resin 6 by the transfer mold process allows the sealing resin 6 to accurately fill the junction between the semiconductor chip 1 and the wiring board 3.

<Second Preferred Embodiment>

Figure 2:
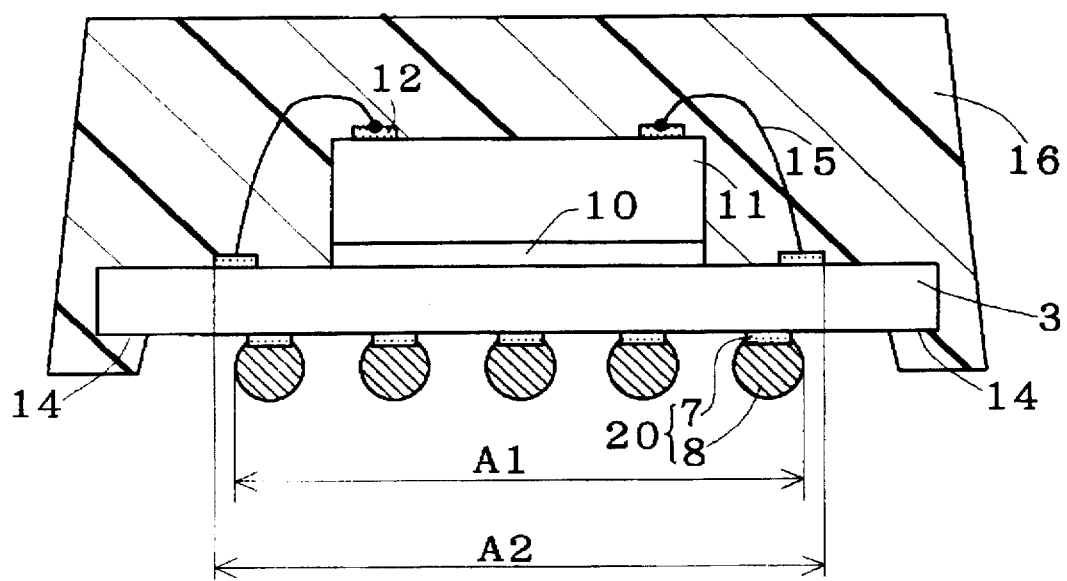
FIG. 2 is a cross-sectional view of the semiconductor device according to a second preferred embodiment of the present invention.

FIG. 2 is a cross-sectional view of the semiconductor device according to a second preferred embodiment of the present invention. As shown, a semiconductor chip 11 is placed on and bonded to the wiring board 3 by an adhesive 10. A plurality of pad electrodes 12 are formed on the upper surface of the semiconductor chip 11.

The plurality of chip connecting patterns 4 are formed on the upper surface of the wiring board 3 to surround the semiconductor chip 1, and the plurality of external electrode portions 20 are formed on the lower surface thereof in the same fashion as in the first preferred embodiment. The plurality of chip connecting patterns 4 are electrically connected to corresponding external electrode portions 20 (the substrate connecting patterns 7), and are connected to corresponding pad electrodes 12 through fine metal lines 15 by wire bonding, respectively. The wiring board 3 may include, but is not limited to, a glass fiber reinforced epoxy resin substrate, a polyimide tape, and the like.

A sealing resin 16 is formed to cover the whole semiconductor chip 11 including the plurality of pad electrodes 12, the upper surface of the wiring board 3 including the plurality of chip connecting patterns 4, the side surface of the wiring board 3, and the peripheral area 14 of the lower surface of the wiring board 3 which surrounds the area A1 wherein the external electrode portions 20 are formed. The sealing resin 16 is formed by the transfer mold process in the same fashion for the first preferred embodiment.

The area A1 wherein the plurality of external electrode portions 20 are formed is smaller than the area A2 wherein the plurality of chip connecting patterns 4 including the semiconductor chip 11 are formed.

The semiconductor device having such a construction according to the second preferred embodiment is placed on a mounting substrate (not shown,) and then heat is applied to melt and connect together the connecting terminals 8 of the external electrode portions 20 and corresponding connecting terminals on the mounting substrate. This allows the semiconductor device to be mounted on the mounting substrate.

In the semiconductor device of the second preferred embodiment, the area A1 wherein the plurality of external electrode portions 20 are formed is smaller than the area A2 wherein the plurality of chip connecting patterns 4 including the semiconductor chip 11 are formed. The area A1 is formed so that it falls within an area corresponding to the area A2. Thus, the size of the semiconductor device may be reduced in corresponding relation to a size specified by the area A1 wherein the chip connecting patterns 4 are formed.

The reduction of the area A1 wherein the external electrode portions 20 (the substrate connecting patterns 7) are formed decreases the total wiring length of the substrate connecting patterns 7, accordingly reducing the inductance caused in the wiring. This achieves a semiconductor device having improved electrical characteristics.

The sealing resin 16 for the semiconductor device of the second preferred embodiment is formed to cover the whole upper surface of the wiring board 3 including the chip connecting patterns 4, effectively suppressing warpage in the junction surfaces of the semiconductor chip 11 and the wiring board 3 through the adhesive 10.

The sealing resin 16 for the semiconductor device of the second preferred embodiment is formed also on the side surface of the wiring board 3 and on the peripheral area 14 of the lower surface of the wiring board 3 which surrounds the area A1 wherein the external electrode portions 20 are formed. This provides a higher bonding strength between the sealing resin 16 and the wiring board 3 to suppress warpage in the junction surfaces more effectively and to further improve the reliability of the device.

The sealing resin 16 for the semiconductor device of the second preferred embodiment is transfer molded to of strongly suppress the warpage in the junction surfaces.

<Variations>

Figure 3:
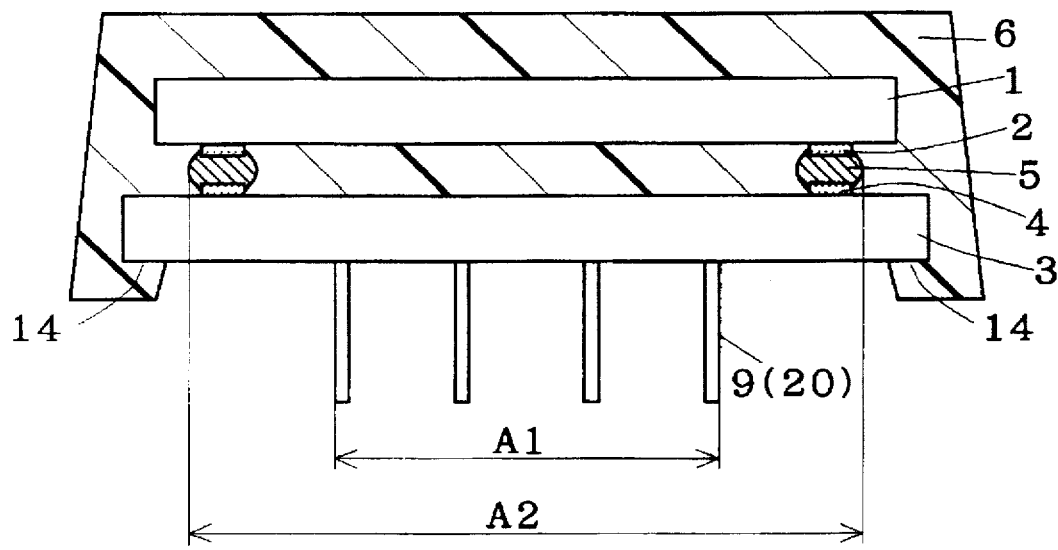
FIGS. 3 and 4 are cross-sectional views of variations of the first preferred embodiment of the present invention.

The semiconductor device of the first preferred embodiment comprises the external electrode portions 20 each including the substrate connecting pattern 7 and the connecting terminal 8. As illustrated in FIG. 3, each of the external electrode portions 20 may include a branch-like connecting pin 9, and may use a conventional lead or a thin solder. The material and structure of the external electrode portions 20 are not limited. This is also true for the external electrode portions 20 of the semiconductor device of the second preferred embodiment.

Figure 4:
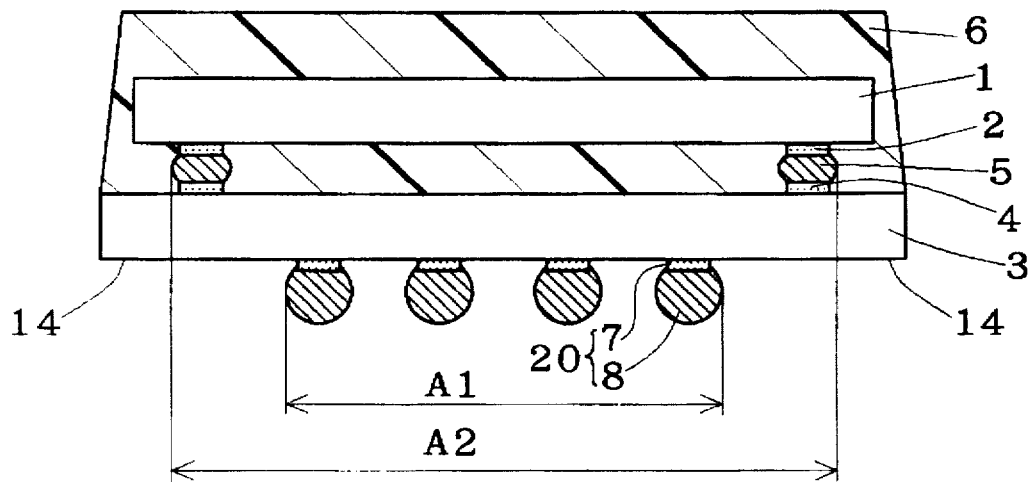
Figure 5:
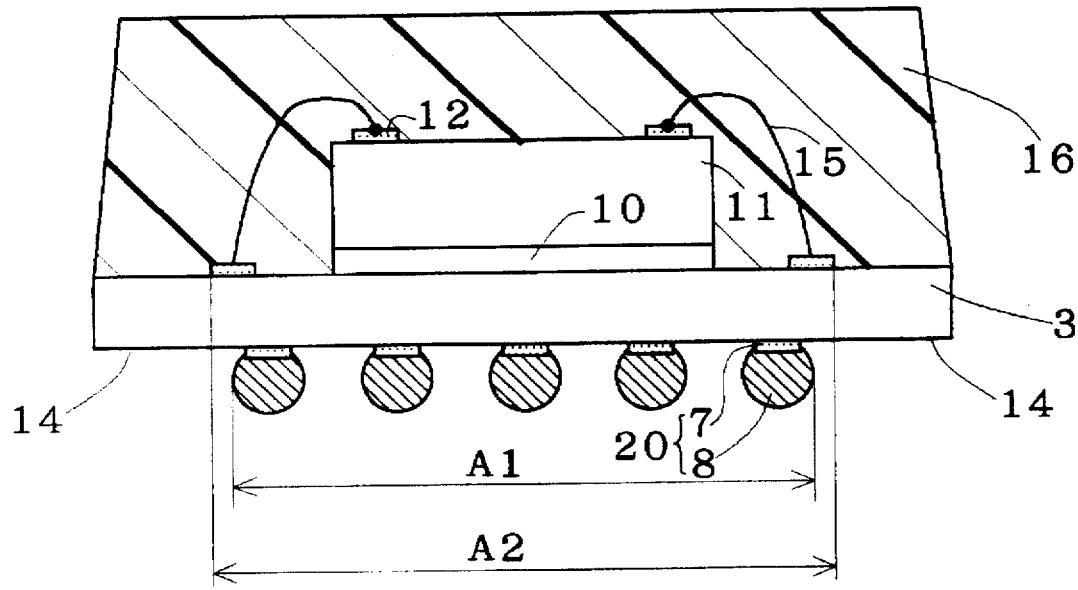
FIG. 5 is a cross-sectional view of a variation of the second preferred embodiment of the present invention.
Figure 6:
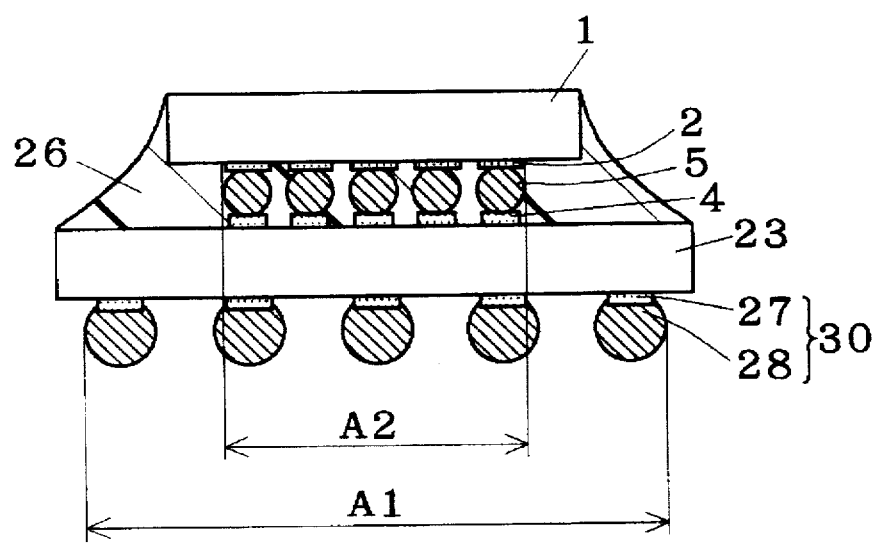
FIG. 6 is a cross-sectional view of a background art semiconductor device.

The sealing resin 6 of the first preferred embodiment and the sealing resin 16 of the second preferred embodiment extend from the side surface of the wiring board 3 to a part of the lower surface thereof. Referring to FIGS. 4 and 5, the sealing resin 6 and the sealing resin 16 may be formed only on the upper surface of the wiring board 3. In the structures of FIGS. 4 and 5, however, the bonding strength between the sealing resin 6 (16) and the wiring board 3 is lower than that in the semiconductor device of the first and second preferred embodiments.

While the invention has been described in detail, the foregoing description is in all aspects illustrative and not restrictive. It is understood that numerous modifications and variations can be devised without departing from the scope of the invention.

I claim:

1. A semiconductor device comprising:
   a semiconductor chip having first and second major surfaces, and a plurality of pad electrodes on the second major surface;
   a wiring board having first and second major surfaces, the second major surface of said semiconductor chip facing the first major surface of said wiring board, said wiring board including a plurality of chip connecting patterns arranged on the first major surface of said wiring board in a first array having a first outer dimension extending from one outside edge of said first array to another, opposite outside edge of said first array, and a plurality of external electrode portions arranged on the second major surface of said wiring board in a second array having a second outer dimension extending from one outside edge of said second array to another, opposite outside edge of said second array, respective chip connecting patterns being electrically connected to corresponding external electrode portions and electrically connected to corresponding pad electrodes; and
   a resin covering said semiconductor chip including said plurality of pad electrodes, and the first major surface of said wiring board including said plurality of chip connecting patterns, wherein the second outer dimension is smaller than the first outer dimension.

2. The semiconductor device of claim 1 comprising:

a plurality of connecting electrodes directly and respectively connected to corresponding pad electrodes, and respective chip connecting patterns directly connected to corresponding connecting electrodes.

3. The A semiconductor device comprising;

a semiconductor chip having first and second major surfaces, and a plurality of pad electrodes on the first major surface;

a wiring board having first and second major surfaces, the second major surface of said semiconductor chip facing the first major surface of said wiring board, said wiring board including a plurality of chip connecting patterns on the first major surface of said wiring board, surrounding said semiconductor chip, and arranged in a first array having a first outer dimension extending from one outside edge of said first array to another, opposite outside edge of said first array, and a plurality of external electrode portions arranged on the second major surface of said wiring board in a second array having a second outer dimension extending from one outside edge of said second array to another, opposite outside edge of said second array, respective chip connecting patterns being electrically connected to corresponding external electrode portions and electrically connected to corresponding pad electrodes by bonded metal wires bonded to corresponding pads a respective wire bonding points; and a resin covering said semiconductor chip including said plurality of pad electrodes, the first major surface of said wiring board including said plurality of chip connecting patterns, and the bonded metal wires, wherein the second outer dimension is smaller than the first outer dimension, and a distance between an end of said wiring board and a wire bonding point nearest that end is shorter than a distance between that end of said wiring board and the external electrode portion nearest that end.

4. The semiconductor device of claim 3, wherein said semiconductor chip contacts and is bonded to said wiring board.

5. The semiconductor device of claim 2, wherein said resin is formed by transfer molding.

6. The semiconductor device of claim 5, wherein a distance between an end of said wiring board and the outside edge of said first array is shorter than a distance between the end of said wiring board and the outside edge of said second array, and wherein said resin extends from a side surface of said wiring board and covers a part of the second major surface of said wiring board except where said second array is located.

7. The semiconductor device of claim 6, wherein each of said plurality of external electrode portions comprises:

a conductive pattern connected directly to the second major surface of said wiring board; and a substantially spherical external electrode connected directly to said conductive pattern.

8. The semiconductor device of claim 6, wherein each of said plurality of external electrode portions includes a branch-like connecting pin.

9. The semiconductor device of claim 3, wherein said resin is formed by transfer molding.

10. The semiconductor device of claim 9, wherein a distance between an end of said wiring board and the outside edge of said first array is shorter than a distance between the end of said wiring board and the outside edge of said second array, and wherein said resin extends from a side surface of said wiring board and covers a part of the second major surface of said wiring board except where said second array is located.

11. The semiconductor device of claim 10, wherein each of said plurality of external electrode portions comprises:

a conductive pattern connected directly to the second major surface of said wiring board; and a substantially spherical external electrode connected directly to said conductive pattern.

12. The semiconductor device of claim 10, wherein each of said plurality of external electrode portions includes a branch-like connecting pin.

* * * * *

UNITED STATES PATENT AND TRADEMARK OFFICE
CERTIFICATE OF CORRECTION

PATENT NO. : 5,708,304
DATED : January 13, 1998
INVENTOR(S) : Tomita

It is certified that error appears in the above-indentified patent and that said Letters Patent is hereby corrected as shown below:

```
Column 7, Line 6, delete "The"

Line 6, change ";" to --:--;

Line 27, change "a" to --at--.
```

Signed and Sealed this

Tenth Day of March, 1998

Attest:

BRUCE LEHMAN

*Attesting Officer*     Commissioner of Patents and Trademarks